(12) United States Patent  
Huang et al.

(10) Patent No.: US 9,395,768 B2  
(45) Date of Patent: Jul. 19, 2016

(54) FLASH DRIVE

(71) Applicant: PHISON ELECTRONICS CORP., Miaoli (TW)

(72) Inventors: Po-Tsang Huang, Miaoli County (TW); Chun-Yao Chang, Changhua County (TW)

(73) Assignee: PHISON ELECTRONICS CORP., Miaoli (TW)

(*) Notice: Subject to any disclaimer, the term of this patent is extended or adjusted under 35 U.S.C. 154(b) by 28 days.

(21) Appl. No.: 14/492,078

(22) Filed: Sep. 22, 2014

(65) Prior Publication Data

US 2016/0054766 A1 Feb. 25, 2016

(30) Foreign Application Priority Data

Aug. 21, 2014 (TW) .............................. 103128780 A

(51) Int. Cl.
*G06F 1/16* (2006.01)
*G06F 1/18* (2006.01)

(52) U.S. Cl.
CPC ..................................... *G06F 1/187* (2013.01)

(58) Field of Classification Search
CPC ................ G06F 1/184–1/186; G06F 1/1656; G06K 19/07728; H05K 5/0278; H05K 5/0217; H05K 5/0269
USPC ...................................................... 361/679.32
See application file for complete search history.

(56) References Cited

U.S. PATENT DOCUMENTS

| | | | | |
|---|---|---|---|---|
| 6,792,487 B2 * | 9/2004 | Kao | ........................ | H01R 24/62 710/62 |
| 7,361,032 B2 * | 4/2008 | Loftus | ................ | H01R 13/4538 439/131 |
| 7,433,712 B2 * | 10/2008 | Moran | .................... | G06Q 50/24 455/556.1 |
| 7,787,243 B2 * | 8/2010 | Salazar | ................. | G06F 13/378 361/679.31 |
| 7,869,219 B2 * | 1/2011 | Ma | ....................... | G11C 11/5621 361/737 |
| 8,192,211 B1 * | 6/2012 | Huang | ................. | H01R 13/447 439/131 |
| 8,254,132 B2 * | 8/2012 | Lin | ......................... | G06K 19/07 361/728 |
| 8,622,757 B2 * | 1/2014 | Hsu | ..................... | H01R 13/4538 439/131 |
| 9,010,162 B2 * | 4/2015 | Thyn | ..................... | A45C 11/324 70/456 R |
| 2009/0021904 A1 * | 1/2009 | Yang | .................... | H05K 5/0278 361/679.31 |
| 2010/0281209 A1 * | 11/2010 | Ni | ..................... | G06K 19/07732 711/103 |
| 2010/0321878 A1 * | 12/2010 | Huang | ................. | G06K 19/077 361/679.31 |
| 2012/0225569 A1 * | 9/2012 | Zhang | .............. | G06K 19/07732 439/55 |
| 2012/0268883 A1 * | 10/2012 | Lo | ........................ | H05K 5/0278 361/679.31 |
| 2013/0023135 A1 * | 1/2013 | Nakamura | ........... | H05K 5/0278 439/153 |

FOREIGN PATENT DOCUMENTS

TW           M251249            11/2004

* cited by examiner

*Primary Examiner* — Anthony Q Edwards
(74) *Attorney, Agent, or Firm* — Jianq Chyun IP Office

(57) ABSTRACT

A flash drive including a housing, a storage module, and at least one elastic member is provided. The housing is flexible and an inner space is formed by the housing. The storage module is movably disposed in the inner space. The elastic member is disposed in the inner space and connected between the storage module and the housing. The housing is adapted to be deformed by a force to compress the inner space, so as to drive a portion of the storage module to be exposed outside the housing and deform the elastic member.

9 Claims, 10 Drawing Sheets

FLASH DRIVE

CROSS-REFERENCE TO RELATED APPLICATION

This application claims the priority benefit of Taiwan application serial no. 103128780, filed on Aug. 21, 2014. The entirety of the above-mentioned patent application is hereby incorporated by reference herein and made a part of this specification.

BACKGROUND

1. Technical Field

The invention relates to a flash drive.

2. Description of Related Art

With development of multimedia technology, storage capacity required for digital data goes larger and larger. Conventional floppy disk in 1.44 MB features in its portable characteristic but still fails to meet the requirement of large storage capacity. Although a conventional hard disk provides a large storage capacity, it still suffers in bulk size which leads to inconvenient carrying. Recently, with the popularization of the universal serial bus (USB) interface and the reduction of the price of the flash memory, USB flash disks advantaged in large storage capacity, high compatibility and portability are broadly applied in data transmission between various computers and storage devices.

The flash disk featuring in large storage capacity, plug-and-play, compact size and portability has taken the place of the floppy disk. Generally, the flash disk is electrically connected to a computer host and a storage device through a connecting member (e.g., a USB plug or a IEEE 1394 plug) and accommodated by a protection member. Accordingly, it is an important issue for manufacturers of the flash drive as how to protect the connecting member from damages due to collision with external objects and to move and position the connecting member smoothly in the protection member.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The invention is directed to a flash drive, capable of driving a storage module therein through a flexible housing and an elastic member.

The flash drive of the invention includes a housing, a storage module and at least one elastic member. The housing is flexible and an inner space is formed by the housing. The storage module is movably disposed in the inner space. The elastic member is disposed in the inner space and connected between the storage module and the housing. The housing is adapted to be deformed by a force to compress the inner space, so as to provide a pushing force to the storage module for moving towards a first direction and deform the elastic member.

Based on above, because the housing of the flash drive is flexible, when the housing is deformed by the force, the storage module disposed in the housing may be driven to move in the housing so as to expose or hide the connector thereof. Furthermore, the elastic member is connected between the storage module and the housing to provide the pushing force (or the pulling force) to storage module for moving a portion of the storage module out from (or into) the housing. Accordingly, users is able to move the storage module and the connector thereof by applying the to the housing and stop applying the force.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
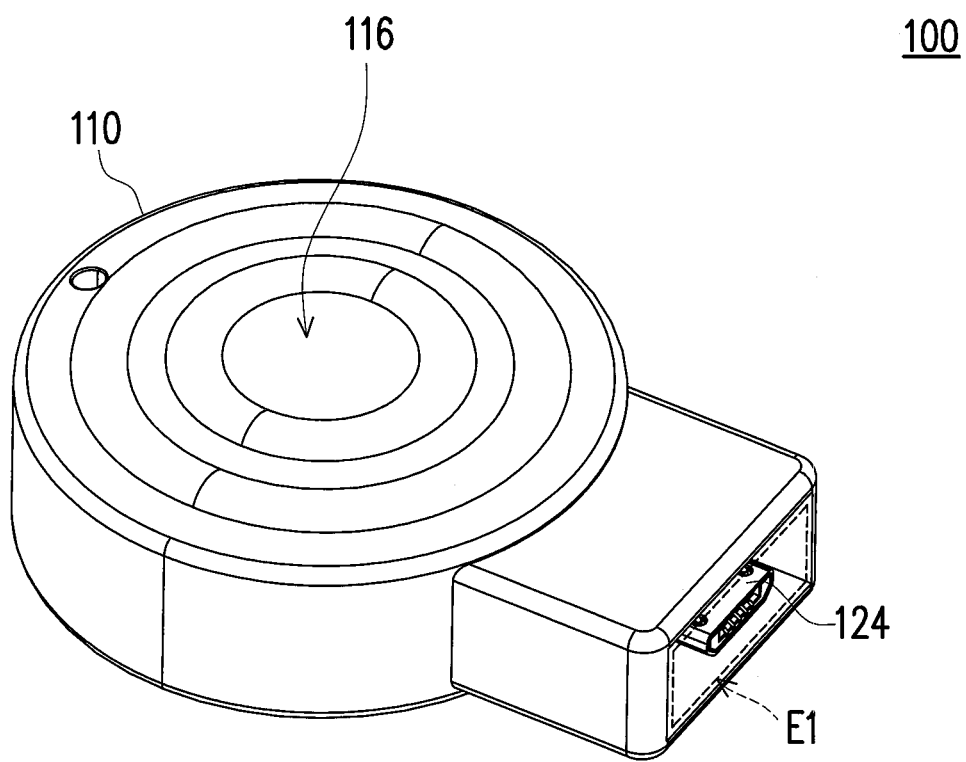
FIG. 1 is a schematic view of a flash drive according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Figure 2:
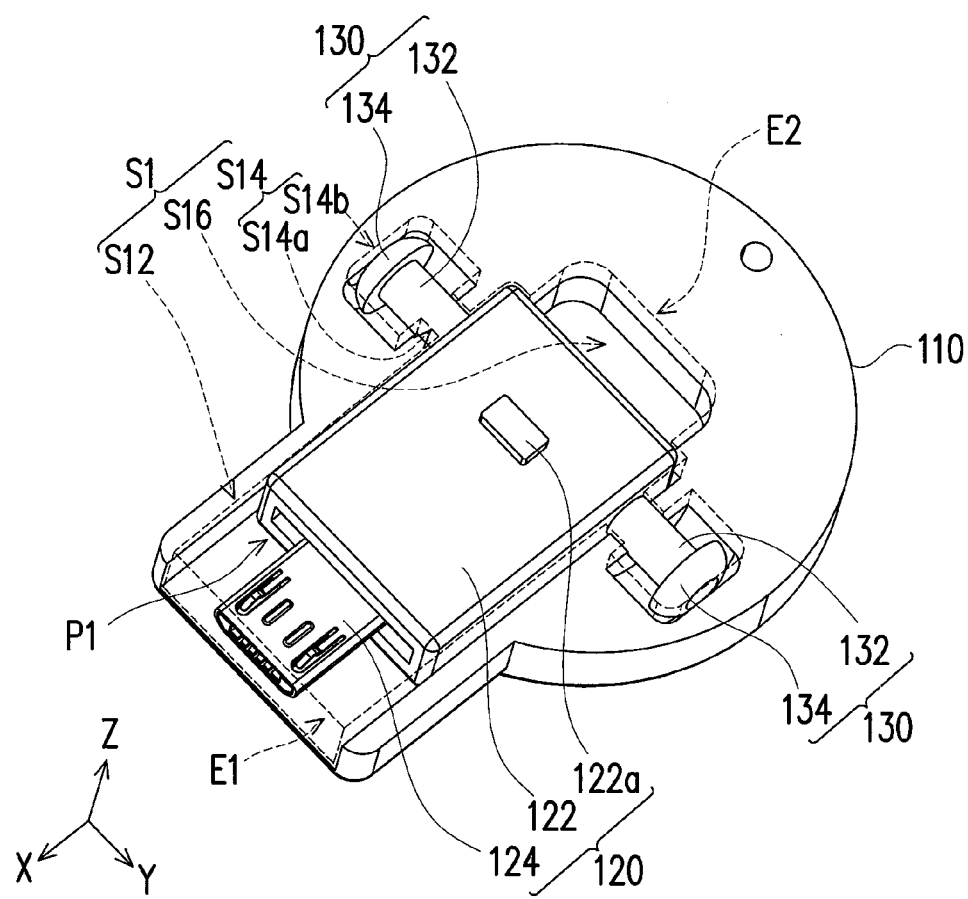
FIG. 2 and FIG. 3 are schematic views respectively illustrating a portion of the flash drive of FIG. 1 from different perspectives.
Figure 3:
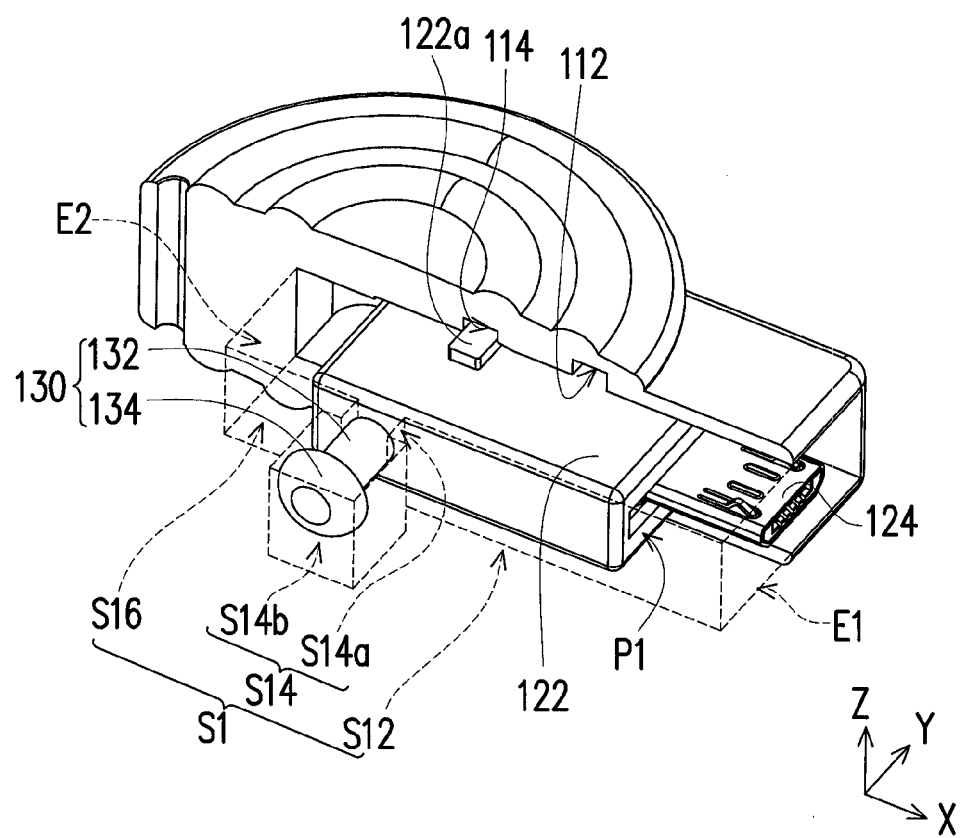

FIG. 1 is a schematic view of a flash drive according to an exemplary embodiment of the invention. FIG. 2 and FIG. 3 are schematic views respectively illustrating a portion of the flash drive of FIG. 1 from different perspectives. Herein, illustration for a portion of a housing 110 is omitted in order to identify members mounted therein more clearly. Further, Cartesian coordinate system is also provided in related drawings to facilitate subsequent descriptions. Referring to FIG. 1 to FIG. 3, in the present exemplary embodiment, a flash drive 100 includes the housing 110, a storage module 120 and elastic members 130. Among them, the housing 110 is made of a flexible material, and the flexible material can be deformed by an external force to correspondingly generate a stress on the inside. When the external force is no longer applied, the housing 110 is restored to its original state. The housing 110 is made of, for example, rubbers or elastic yarns. Therefore, the housing 110 is flexible for a user to press, and the housing 110 is also elastic so that it can be restored when the user stops pressing. Further, the housing 110 is a hollow structure in which an inner space S1 is formed for the storage module 120 to be movably disposed therein, so that the elastic members 130 can be disposed in the inner space S1 and each of them is connected between the storage module 120 and the housing 110.

Furthermore, the storage module 120 is, for example, a system in package (SIP) module, which is a package module formed by a package having one chip or multiple chips together any one of additional elements including a passive element, a capacitor, a resistor, a connecting interface, an antenna and so on. Accordingly, the storage module 120 can be divided into a storage element 122 and a connector 124 electrically connected to each other, so that the storage element 122 is adapted to use the connector 124 as the connecting interface to be electrically connected to other electronic devices (not illustrated). Herein, the illustrated connector 124 is in compliance with the specification of micro universal series bus (Micro-USB), but the invention is not limited thereto.

In addition, the inner space S1 of the housing 110 further includes a channel S12 and a pair of fourth positioning portions S14. The channel S12 has an opening side E1 and a closed side E2. The storage element 122 and the connector 124 are movably disposed in the channel S12. As shown in FIG. 2, the connector 124 is relatively closer to the opening side E1 than the storage element 122. The fourth positioning portions S14 are located at two opposite sides of the channel S12 but not located on a moving path of the storage element 122. That is, the fourth positioning portions S14 are located on positions which are deviated from the channel S12 but not on an extending axial direction of the channel S12. Herein, the channel S12 extends along a X-axis, and each of the pair of fourth positioning portions S14 is disposed next to the channel S12 in relative to the channel S12 along a Y-axis, so that the storage module 120 is capable of moving along the X-axis. The connector 124 also extends along the X-axis, so that the user is able to connect the connector 124 extended outside the housing 110 to the other electronic devices along the X-axis.

In a pair of the elastic members 130 as depicted in the present exemplary embodiment, one end of each of the elastic members 130 is positioned at the storage element 122, and another end of each of the elastic members 130 is positioned at the fourth positioning portions S14 respectively. As shown in FIG. 2 and FIG. 3, the elastic members 130 are disposed symmetrically on two opposite sides of the storage element 122 about the X-axis. Specifically, each of the elastic members 130 has a connecting portion 132 and a crown portion 134. One end of the connecting portion 132 is connected to the storage element 122, and the crown portion 134 extends from another end of the connecting portion 132 to from a cap-like structure. Correspondingly, each of the fourth positioning portion S14 has a position limiting structure S14a and a latch structure S14b, and the position limiting structure S14a connects between the latch structure S14b and the channel S12 to from a necking-down concave space. Accordingly, the necking-down concave space allows the crown portion 134 of the elastic member 130 to be latched to the latch structure S14b of the fourth positioning portion S14. Herein, connection methods for connecting the elastic member 130 respectively with the storage element 122 and the housing 110 are not particularly limited. In the invention, the connecting methods can refer to various different technical means such as adhesion, thermal welding, latching, fastening or integrated forming. In the present exemplary embodiment, the one end of the elastic member 130 is physically connected to the storage element 122 through existing techniques (such as adhesion, thermal welding, thermoforming or injection molding) to physically connect the elastic member 130 and the storage element 122 together, and the another end of the elastic member 130 is connected to the housing 110 by the latch structure S14b. In another embodiment not illustrated, the elastic member can also be connected to the storage element by the latch structure, and the elastic member and the fourth positioning portion can be physically connected together. The connection methods can be changed appropriately based on demands of manufacture and usage.

Figure 4:
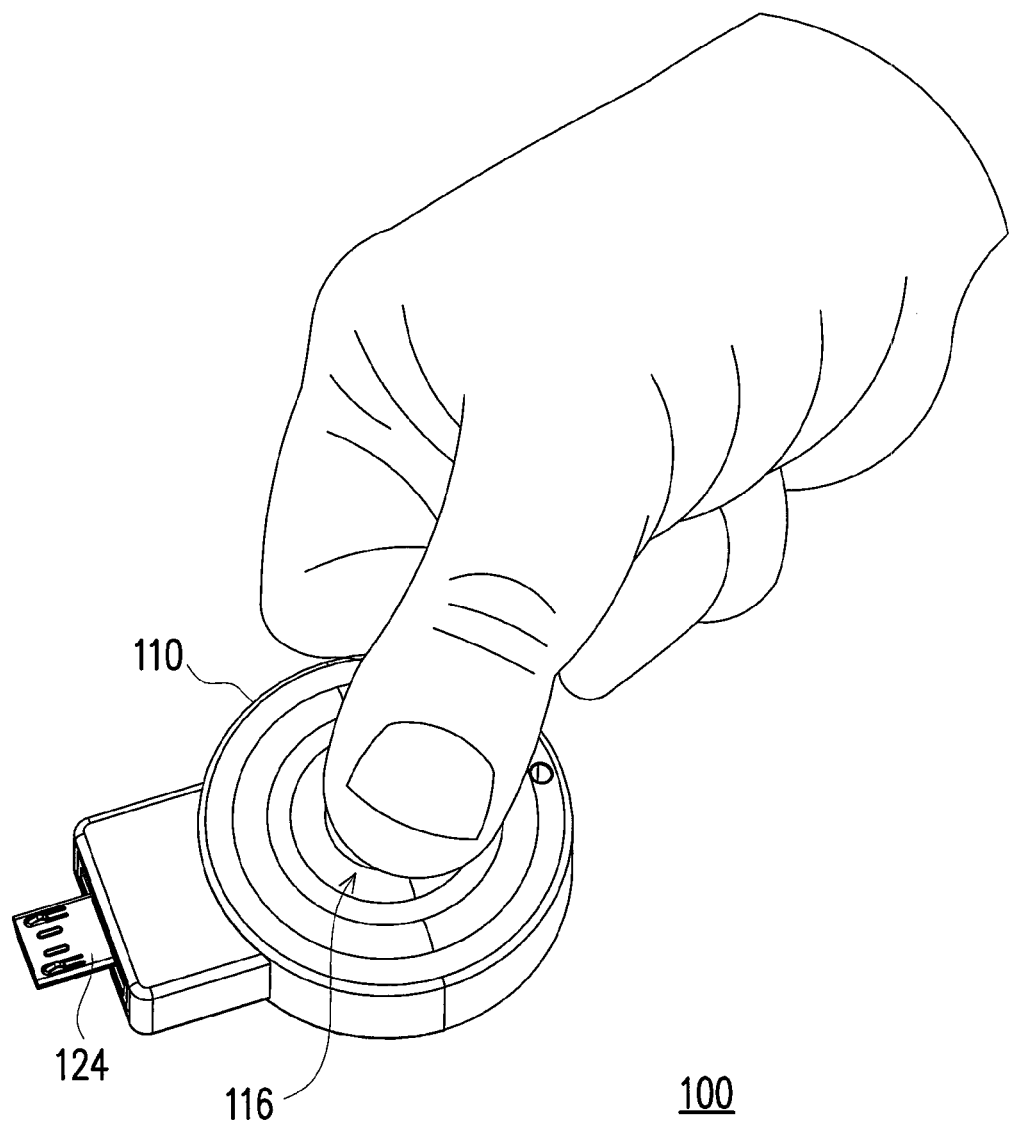
FIG. 4 is a schematic view illustrating a state of the flash drive of FIG. 1 when the force is applied thereto.
Figure 5:
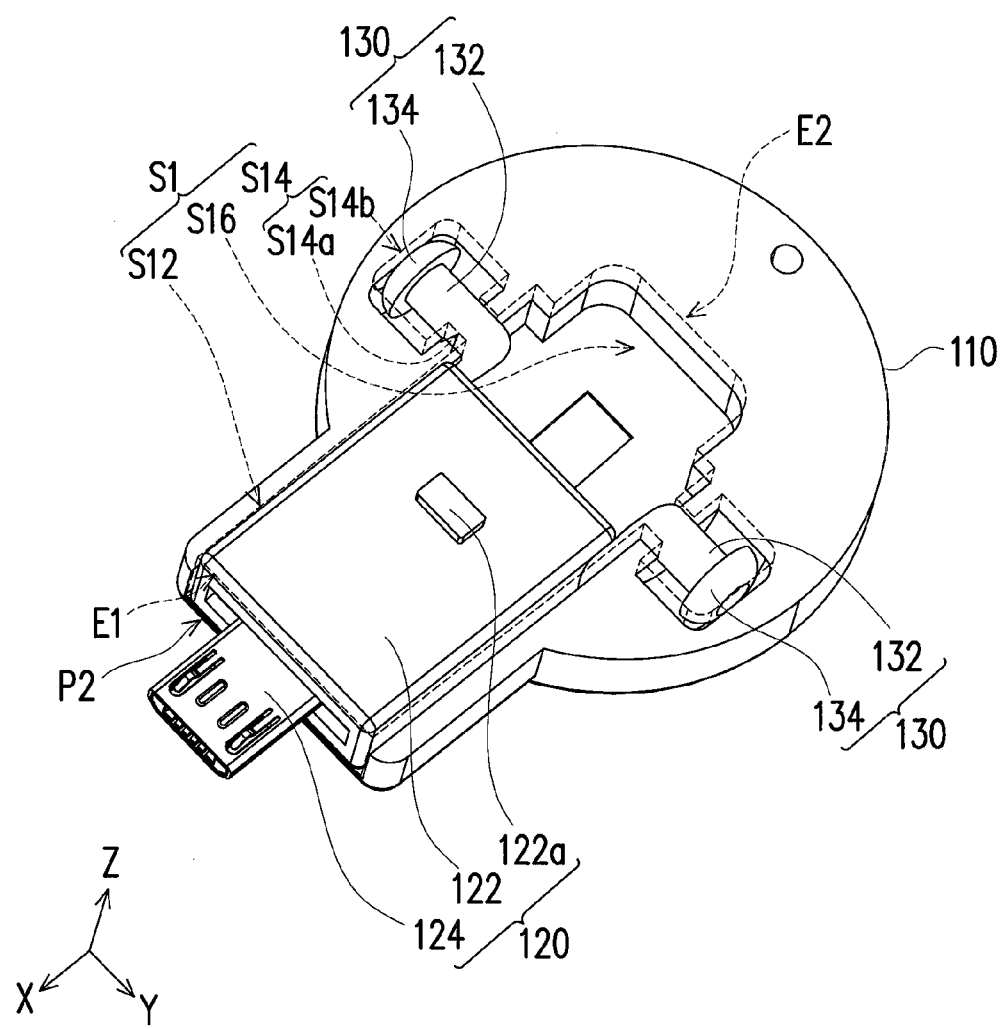
FIG. 5 and FIG. 6 are schematic views respectively illustrating a portion of the flash drive of FIG. 4.
Figure 6:
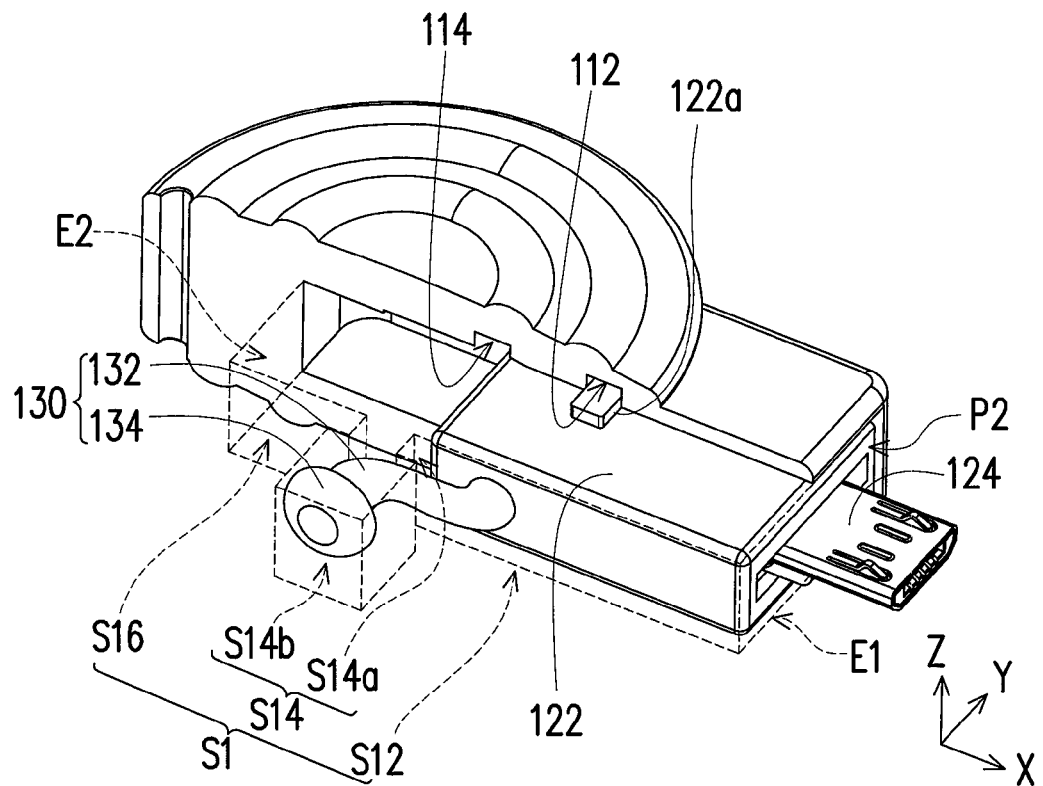

FIG. 4 is a schematic view illustrating a state of the flash drive of FIG. 1 when the force is applied thereto. Further description is provided below with the user pressing the housing 100 with one finger as an example. FIG. 5 and FIG. 6 are schematic views respectively illustrating a portion of the flash drive of FIG. 4, in which illustration of the portion of the housing 110 is omitted in order to clearly identify relative positions of the components therein in the state shown in FIG. 4. Meanwhile, in the present exemplary embodiment, a position where the storage element 122 in FIG. 1 to FIG. 3 is located is marked as a first position P1, and a position where the storage element 122 is located in FIG. 4 to FIG. 6 is marked as a second position P2.

Referring to both FIG. 5 and FIG. 6 with reference to FIG. 2 and FIG. 3, in the present exemplary embodiment, when the storage element 122 is located at the first position P1, a space S16 is maintained between one end of the storage element 122 away from the connector 124 and the closed side E2 of the channel S12. Moreover, the housing 110 further includes a pressing portion 116 located on an outer surface, and an orthogonal projection of the pressing portion 116 on the channel S12 is at least partially overlapped with the space S16. In addition, referring back to FIG. 2, FIG. 3, FIG. 5 and FIG. 6, no matter what state is the storage module 120 in (i.e., regardless of where the storage module 120 is located in the inner space S1), the storage element 122 fits a contour outline of the channel S12 in order to maintain an air tightness of the inner space S1. Accordingly, when the user presses the housing 110 as shown in FIG. 4, a squeezing effect is generated to the space S16. That is, air at the space S16 is compressed to generate pressure for pushing the storage element 122 to move in the channel S12, so as to drive the storage element 122 to move in a direction opposite to the closed side E2 of the channel S12 (i.e., moving from the first position P1 towards the second position P2) until the connector 124 is exposed outside the housing 110. Naturally, while the housing 110 is deformed by the force, in addition to air compressed at the space S16, the deformed housing 110 also presses against the storage element 122 to further facilitate in pushing the storage element 122 to move in the channel S12, so as to achieve the same effect of exposing the connector 124 outside the housing 110.

Referring back to FIG. 3 and FIG. 6, the storage element 122 of the present exemplary embodiment includes a first positioning portion 122a, and the housing 110 further includes a second positioning portion 112 and the third positioning portion 114. The second positioning portion 112 and the third positioning portion 114 are located at the inner space S1, and the second positioning portion 112 and the third positioning portion 114 are located on a moving path of the first positioning portion 122a. When the storage element 122 is located at the first position P1, the first positioning portion 122a and the second positioning portion 112 are latched to each other. When the storage element 122 is located at the second position P2, the first positioning portion 122a and the third positioning portion 114 are latched to each other. Accordingly, the storage element 122 can be maintained at the first position P1 or the second position P2.

Detailed description related to above motion is provided as follows. When the storage module 120 is located at the first position P1, the storage element 122 and the connector 124 are both hidden in the inner space S1 formed by the housing 110. Once the housing 110 is pressed (i.e., applying the force to the pressing portion 116 as described above), a latching relation between the first positioning portion 122a and the second positioning portion 112 is released as the housing 110 deforms, so that the storage element 122 can be driven by the compressed air and the deformed housing 110 to move in the channel S12. Subsequently, when the storage element 122 moves to the second position P2 to expose the connector 124 outside the housing 110, if the user stops applying the force to the housing 110 at the time so the housing 110 is restored back to its original state through an elasticity thereof, the first positioning portion 122a and the third positioning portion 114 can be latched to each other, such that the storage element 122 is maintained at the second position P2.

It should be noted that, when the storage module 120 is located at the first position P1, the connecting portion 132 of the elastic member 130 is perpendicular to a lateral side of the storage element 122 (i.e., an extending direction of the connecting portion 132 is parallel to the Y-axis). Also, during the process in which the storage module 120 moves from the first position P1 to the second position P2, the crown portion 134 of the elastic member 130 is latched to the fourth positioning portion S14 (i.e., the crown portion 134 of the elastic member 130 is regarded as fixed to the housing 110). Therefore, the connecting portion 132 of the elastic member 130 is stretched and deformed along the channel S12 as the storage element 122 moves. That is, during the process when the user pushes the storage element 122 to move, the force applied by the user must be able to overcome the elasticity of the elastic member 130. If the user stops applying the force, the storage element 122 can go back to the first position P1 through the elasticity of the elastic member 130. Further, when the storage module 120 moves to the second position P2, if the housing 110 is restored to its original state after the force is no longer applied, the first positioning portion 122a can be latched together with the third positioning portion 114. Accordingly, the first positioning portion 122a is capable of resisting the elasticity of the elastic member 130 to maintain the storage module 120 at the second position P2 while the elastic member 130 is in a state of elastic deformation.

Correspondingly, when the user wishes to stop using the flash drive 100 and begin restoring the storage module 120 back to its original position, the user can apply the force again to the housing 110 to deform the housing 110. Once a latching relation between the first positioning portion 122a and the second positioning portion 114 is released, the storage module 120 can be moved back to the first position P1 along the channel S12 through the elasticity of the elastic member 130, so that the connector 124 is hidden in the inner space S1 once again. Accordingly, the housing 110 is capable of providing a pushing force to the storage module 120 for moving towards a positive X-axis direction through material characteristics (flexibility and elasticity) of the housing 110 and the elastic member 130, and the elastic member 130 is capable of providing a pulling force to the storage module 120 for moving towards a negative Y-axis direction by deforming the elastic member 130, such the user can easily operate driving and positioning structures of the flash drive 100 to achieve the effect of moving and positioning the storage module 120.

It should also be noted that, in the present exemplary embodiment, the first positioning portion 122a is a protrusion located on the storage element 122, and each of the second positioning portion 112 and the third positioning portion 114 is a recess on the housing 110 for corresponding to the first positioning portion 122a, but the invention is not limited thereto. In another exemplary embodiment not illustrated, when the first positioning portion is the grove and each of the second positioning portion and the third positioning portion is the protrusion, the effect of the foregoing embodiment can also be achieved. That is, related structures in the existing technologies capable of providing the effect of moving and positioning the members are all applicable in the invention.

Figure 7:
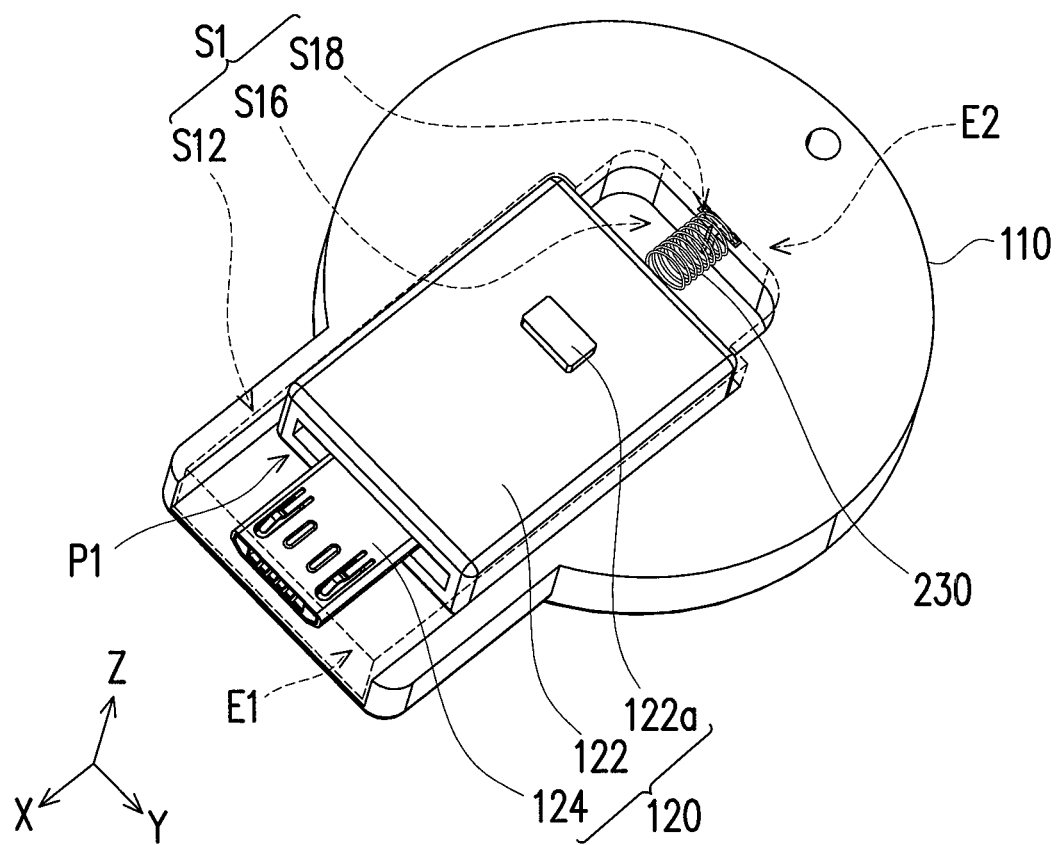
FIG. 7 and FIG. 8 are schematic views respectively illustrating a portion of a flash drive according to another exemplary embodiment.
Figure 8:
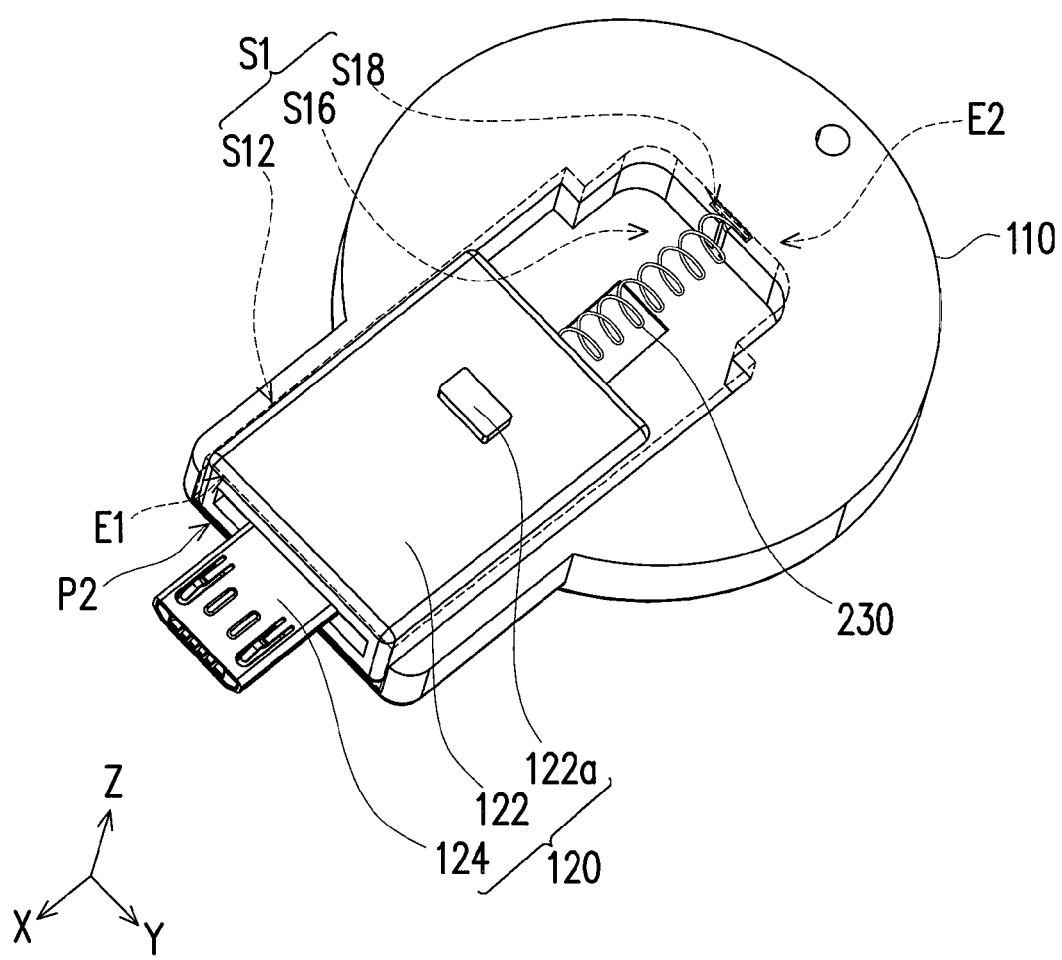

FIG. 7 and FIG. 8 are schematic views respectively illustrating a portion of a flash drive according to another exemplary embodiment, in which states of the storage module moved to different positions with respect to the housing are described. Referring to FIG. 7 and FIG. 8 together, unlike the foregoing embodiment, an elastic member 230 of the present exemplary embodiment is a spring, which is disposed at the space S16 of the inner space S1 and located on the moving path of the storage element 122. The elastic member 230 includes one end positioned at the storage element 122, and another end positioned at the housing 110 and located at the closed side E2 of the inner space S1. More specifically, the inner space S1 of the present exemplary embodiment further includes a fifth positioning portion S18, which is located at the closed side E2 of the inner space S1 and includes a groove shape configured to be latched to the another end of the elastic member 230. As shown in FIG. 7, when the connector 124 is exposed outside the opening side E1, the elastic member 230 is deformed (stretched). In this case, the storage element can be maintained at the second position P2 through the latching relation between the first positioning portion 122a and the second positioning portion 112 as described above (illustrated in FIG. 3 and FIG. 6). Once the housing 110 is deformed by the force to release the latching relation between the first positioning portion 122a and the second positioning portion 112, the storage element 122 can be driven back to the first position P1 through an elasticity of the elastic member 230. Accordingly, the elastic member 230 of the present exemplary embodiment is also capable of achieving the same effect of the foregoing exemplary embodiment.

Figure 9:
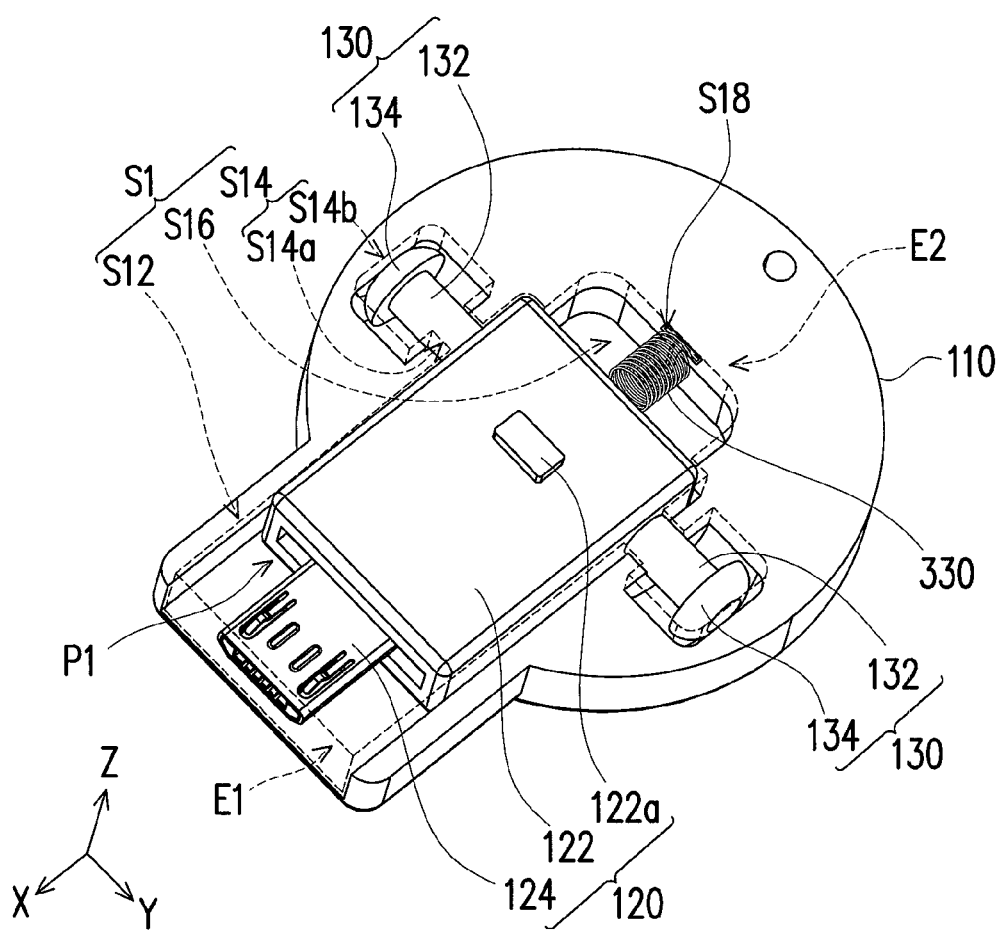
FIG. 9 and FIG. 10 are schematic views respectively illustrating a portion of a flash drive according to yet another embodiment of the invention.
Figure 10:
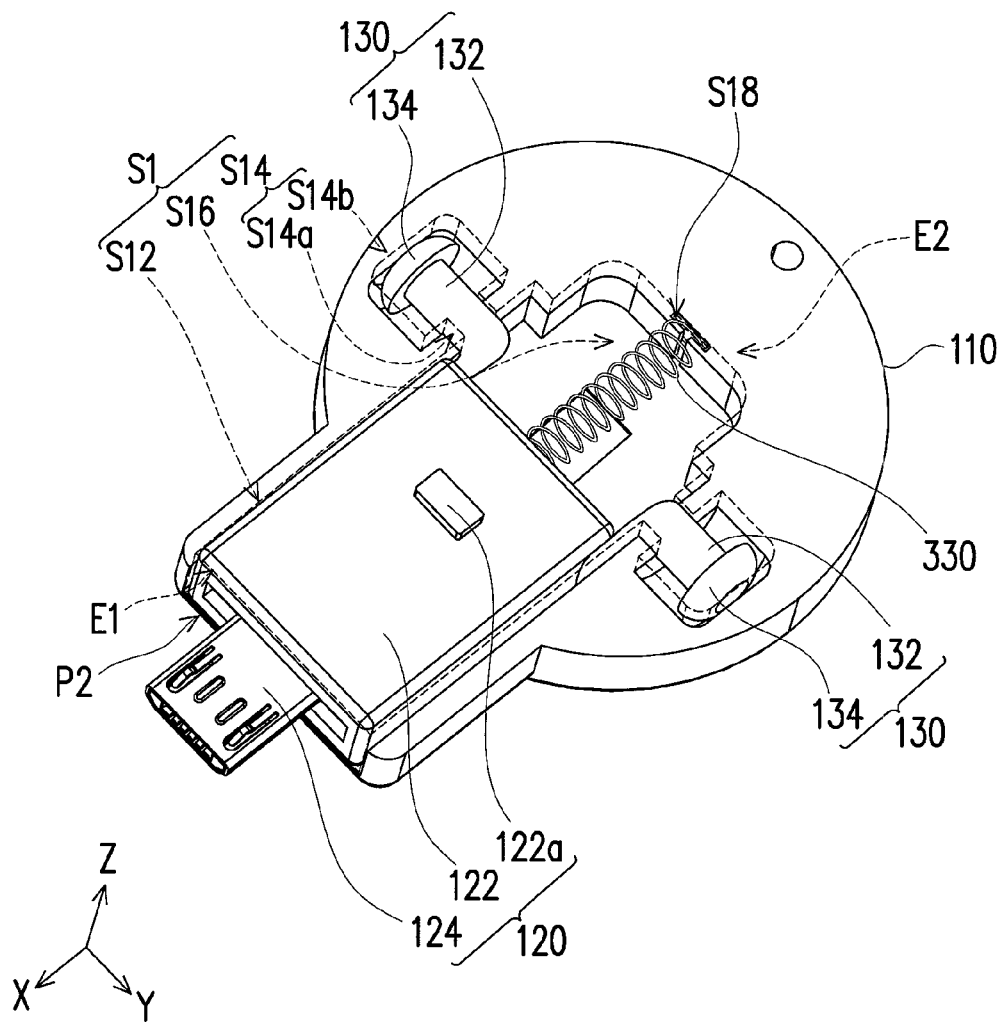

FIG. 9 and FIG. 10 are schematic views respectively illustrating a portion of a flash drive according to yet another embodiment of the invention, in which acting relations between the housing 110 and the storage module 120 are described. In the present exemplary embodiment, the storage module 120 can also achieve the effect of moving the connector 124 out from (or into) the opening side E1 of the housing 110 through cooperation of elastic members 130 and 330 at the same time. Among them, the elastic members 130 are located at the two opposite sides deviated from the moving path of the storage module 120 as described previously, and the elastic member 330 is located at a back side of the storage module 120 (in assumption that the connector 124 is located at a front side of the storage module 120) as similar to the exemplary embodiment of FIG. 7.

Specifically, the elastic member 130 is similar to those illustrated in the FIG. 2, FIG. 3, FIG. 5 and FIG. 6, and served to drive the storage module 120 to move into the housing 110 when the connector 124 is located outside the housing 110. Furthermore, the elastic member 330 is a compression spring, namely, it operates completely opposite to the elastic member 230 illustrated in FIG. 7 and FIG. 8. In other words, the elastic member 330 of the present exemplary embodiment is configured to drive the storage module 120 to move out from the housing 110. Accordingly, when the storage module 120 is located inside the housing 110 (as illustrated in FIG. 9), the elastic member 130 is not deformed by force, but the elastic member 330 is compressed and deformed to provide a power source for moving the storage module 120 out from the housing 110. On the other hand, when the storage module 120 is located at the second position P2 (i.e., the connector 124 is located outside the housing 110), the elastic member 330 is not deformed by force, but the elastic member 130 is stretched and deformed to provide a power source for pulling the storage module 120 back into the housing 110. Accordingly, the storage module 120 is capable of achieving the effect of moving the connector 124 out from (or into) the housing 110 though the cooperation of the elastic members 130 and 330.

In addition, in another exemplary embodiment not illustrated, the housing 110 further includes a gas pocket at the space S16 to prop against in between the housing 110 and the storage module 120. The gas pocket can be deformed when the user presses the housing 110, so as to provide a pushing force to the storage module 120 for moving the connector out from the opening side E1 of the housing 110. Once the force is no longer applied, the gas pocket can restore back to its original state, so that the storage module 120 and the connector 124 thereof can be moved back into the housing 110.

In summary, in aforesaid exemplary embodiments of the invention, because the housing is flexible, the user may press the housing to compress air therein, so that the compressed air and the deformed housing is capable to pushing against the storage module and thereby moving the storage module to expose the connector thereof outside the housing. Furthermore, the latching relations of the positioning portions between the housing and the storage module can be used to position the storage module at the first position hidden in the housing, and to position the storage module at the second position when the connector is exposed outside the housing. In addition, the elastic member is connected between the housing and the storage module, and the storage module is moved out from (or into) the housing according to decompression deformation (or compression deformation) being selected for providing the pushing force (or the pulling force) to the storage module. Accordingly, once the housing is deformed to release the latching relation between the storage module and the housing, the elastic member is capable of restoring the storage module back to its original position (or pushing the connector of the storage module out from the housing).

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A flash drive, comprising:
   a housing being flexible, and an inner space being formed by the housing;
   a storage module, movably disposed in the inner space; and
   at least one elastic member, disposed in the inner space and between the storage module and the housing, the housing being adapted to be deformed by a force to compress the inner space, so as to provide a pushing force to the storage module for moving towards a first direction and deform the elastic member,
   wherein the storage module comprises a storage element and a connector electrically connected to each other, the inner space has a channel connected through to an external environment, the storage element moves between a first position and a second position in the channel, the storage element and the connector are hidden in the inner space when the storage element is located at the first position, and the connector moves out from the inner space when the storage element is located at the second position, and
   wherein the storage element has a first positioning portion, the housing further has a second positioning portion and a third positioning portion, the second positioning portion and the third positioning portion are formed on an inner wall of the housing, the second positioning portion and the third positioning portion are located on a moving path of the first positioning portion, the first positioning portion and the second positioning portion are latched to each other when the storage element is located at the first position, and the first positioning portion and the third positioning portion are latched to each other when the storage element is located at the second position.

2. The flash drive according to claim 1, wherein the storage element fits a contour outline of the channel in order to maintain an air tightness of the inner space.

3. The flash drive according to claim 1, wherein the first positioning portion is a protrusion, and each of the second positioning portion and the third positioning portion is a recess.

4. The flash drive according to claim 1, wherein the inner space further has a pair of fourth positioning portions located at two opposite sides of the channel but not located on a moving path of the storage element, the flash drive comprises a pair of the elastic members, one end of each of the elastic members is positioned at the storage element, and another ends of the elastic members are positioned at the pair of fourth positioning portions respectively.

5. The flash drive according to claim 4, wherein each of the fourth positioning portions has a position limiting structure and a latch structure, the position limiting structure connects between the channel and latch structure, each of the elastic members has a connecting portion and a crown portion, the connecting portion connects to the storage element and passes through the position limiting structure, and the crown portion extends from the connecting portion and latches at the latch structure.

6. The flash drive according to claim 5, wherein the connecting portion is perpendicular to a lateral side of the storage element when the storage element is located at the first position, and the connecting portion is stretched and deformed by the storage element along the channel when the storage element is located at the second position.

7. The flash drive according to claim 1, wherein the channel has an opening side and a closed side opposite to each other, the connector passes through the opening side to move out from the channel when the storage element is located at the second position, and one end of the storage element away from the connector maintains a space with respect to the closed side when the storage element is located at the first position.

8. The flash drive according to claim 7, wherein the housing further has a pressing portion located on an outer surface, and an orthogonal projection of the pressing portion on the channel is at least partially overlapped with the space.

9. The flash drive according to claim 1, wherein the elastic member is configured to provide a force to the storage module for moving towards a second direction, and the first direction is opposite to the second direction.

* * * * *